(12) United States Patent
Dalisay

(10) Patent No.: US 6,802,117 B2
(45) Date of Patent: Oct. 12, 2004

(54) DEVICE FOR CIRCUIT BOARD INSERTION AND EXTRACTION

(76) Inventor: George Dalisay, 3830 NW. 78 La., Hollywood, FL (US) 33024

( * ) Notice: Subject to any disclaimer, the term of this patent is extended or adjusted under 35 U.S.C. 154(b) by 202 days.

(21) Appl. No.: 09/777,369

(22) Filed: Feb. 5, 2001

(65) Prior Publication Data

US 2002/0104211 A1 Aug. 8, 2002

(51) Int. Cl.[7] .............................. B23P 19/04; H05K 7/14
(52) U.S. Cl. .............................. 29/758; 29/764; 29/759; 29/729; 361/798; 361/755; 361/754; 439/160
(58) Field of Search ........................ 29/758, 759, 729, 29/764, 426.5, 267, 278; 361/754, 759, 796, 725, 802, 798, 755; 439/327, 64, 160, 155; 16/429

(56) References Cited

U.S. PATENT DOCUMENTS

| | | | |
|---|---|---|---|
| 4,064,551 A | 12/1977 | Lightfoot | ..................... 361/755 |
| 4,197,572 A * | 4/1980 | Aimar | ......................... 29/764 |
| 4,233,646 A * | 11/1980 | Leung et al. | ................ 361/399 |
| 4,403,408 A | 9/1983 | Koppensteiner et al. | ....... 29/764 |
| 4,716,495 A | 12/1987 | Craker | ........................ 361/391 |
| 4,778,401 A | 10/1988 | Boudreau et al. | ............ 439/153 |
| 4,996,631 A | 2/1991 | Freehauf | ...................... 361/415 |
| 5,506,758 A | 4/1996 | Cromwell | ..................... 361/798 |
| 6,008,995 A | 12/1999 | Pusateri et al. | ............. 361/796 |
| 6,148,506 A | 11/2000 | Vermette | ...................... 29/758 |
| 6,160,717 A * | 12/2000 | Desousa et al. | ............ 361/798 |

* cited by examiner

Primary Examiner—Minh Trinh
(74) Attorney, Agent, or Firm—Pillsbury Winthrop LLP

(57) ABSTRACT

An apparatus for facilitating the insertion and extraction of a PC board into and from a card cage, comprising a mounting body, an engager, and an actuator. In a preferred embodiment, the apparatus has a ring-shaped mounting body having a clearance hole therethrough. The apparatus is slidably and rotatably mounted on a cylindrical rod through the clearance hole such that the apparatus is slidably rotatable along the length of the cylindrical rod. In operation, the engager is positioned in physical contact with the PC board in a notch in the board such that when a force is applied to the actuator, the engager is effected to urge the board to move in the direction of the force.

11 Claims, 5 Drawing Sheets

DEVICE FOR CIRCUIT BOARD INSERTION AND EXTRACTION

FIELD OF THE INVENTION

This invention relates to apparatuses for facilitating the insertion and extraction of circuit boards into and from a card cage.

BACKGROUND OF THE INVENTION

Printed circuit (PC) boards or cards are well known and widely used in various electrical applications. Typically, a PC board comprises a flat rectangular sheet of insulating material, such as glass-fibre reinforced resin, with a number of circuit components mounted thereon and electrical contacts along one edge of the board. It is common to assemble a plurality of PC boards in a closely-spaced parallel relationship in an electronic chassis or card cage, which removably supports the PC boards in parallel slots. A card cage generally contains a backplane having a plurality of electric connectors and card guides or tracks for PC boards to be inserted into the card cage. Inserting a PC board into a card cage along a card guide so that the board's electrical contacts mate with a connector in the backplane of the card cage seats a PC board into the backplane. A plurality of PC boards become interconnected in a card cage when each PC board is fully seated into the backplane of the card cage.

Seating a PC board into and extracting it from a card cage can be difficult because of the tight board-to-board spacing. It is hard to apply the right amount of force in the typically small space available for grasping with a human hand. In addition, because of the small space, the force applied may deviate from the straight linearity, which may impose bending stresses on the board and cause damage to the board.

Various devices have been developed to assist insertion and extraction of PC boards into and from card cages. Many of these devices are developed only for insertion or extraction, but not both. U.S. Pat. No. 4,403,408 to Koppensteiner, et al. describes such a device. For those that are capable of assisting both the insertion and extraction of a PC board into and from a card cage, it is very often required to mount the device onto the PC board. An example of such a device is disclosed in U.S. Pat. No. 5,506,758 to Cromwell. The mounting of a board inserter or extractor onto the board increases the width of the board, which renders fewer boards capable of being assembled in a card cage. Furthermore, these devices are not cost efficient because every board would require its own inserter or extractor.

Accordingly, there exists a need for a simple and low cost device for facilitating the insertion and extraction of a PC board into and from a card cage. The device should also be capable of facilitating the insertion and extraction of PC boards without being attached to the boards.

SUMMARY OF THE INVENTION

The present invention provides an apparatus for facilitating the insertion and extraction of circuit boards into and from a card cage.

Generally, a PC board insertion and extraction apparatus in accordance with the present invention comprises a mounting body, an engager, and an actuator. Preferably, the apparatus is rotatably mounted on a stationary object relative to the PC board such that the required insertion or extraction leverage is provided. In operation, the engager is positioned in physical contact with the PC board in a notch in the board such that when a force is applied to the actuator, the engager is effected to urge the board to move in the direction of the force. To insert a PC board into a card cage, therefore, the engager is positioned at least partially in a notch in the PC board, and a forward force is applied to the actuator toward the card cage, effecting the engager to urge the board into the card cage. The PC board is extracted from the card cage when an opposite force is applied to the actuator.

In one embodiment, the PC board insertion and extraction apparatus has a ring-shaped mounting body having a clearance hole therethrough. The apparatus is slidably and rotatably mountable on a cylindrical rod through the clearance hole such that the apparatus is slidably rotatable along the length of the cylindrical rod.

In a second embodiment, the mounting body is in the shape of the letter "C," and has a clearance hole therethrough and an opening. The apparatus is slidably and rotatably mountable on a cylindrical rod through the clearance hole. Preferably, a support having an extension is mounted on the rod. The extension can be mounted on a front edge of the card cage, or on an assembly rack, or it can be extended downward to the ground. The apparatus is slidable along the length of the rod by using the opening of the mounting body to slide the apparatus through the support.

In a third embodiment, the PC board insertion and extraction device includes a first mounting arc, a second mounting arc, an engager, an actuator, and an interlocking mechanism. The interlocking mechanism interconnects and interlocks the mounting arcs, forming a ring-shaped mounting body having a clearance hole therethrough. The device is slidably and rotatably mountable on a cylindrical rod through the clearance hole. The device may be removed from the cylindrical rod by unlocking the interlocking mechanism and separating the mounting arcs.

In still another embodiments similar to the one immediately above, the mounting arcs interlock to form a "C" shaped mounting body having a clearance hole therethrough and an opening. This device operates similar to the device in the second and third embodiments.

DETAILED DESCRIPTION OF THE INVENTION

In accordance with the present invention, a device for facilitating the insertion and extraction of a PC board into and from a card cage generally comprises three parts: a mounting body, an engager, and an actuator. Preferably, the engager and the actuator are each integrally connected to the mounting body. The mounting body rotatably secures the device on a stationary object relative to the PC board such that the required insertion or extraction leverage is provided. In operation, the engager is positioned in physical contact with the PC board in a notch in the board such that when a force is applied to the actuator, the engager is effected to urge the board to move in the same direction of the force. To insert a PC board into a card cage, therefore, the engager is positioned at least partially in a notch in the PC board, and a forward force is applied to the actuator toward the card cage, effecting the engager to urge the board into the card cage. The PC board is easily extracted from the card cage when an opposite force is applied to the actuator, pulling the actuator and, thus, the engager and the board away from the card cage.

In the following description of the present invention and the operation of the embodiments, like numerals are used to designate like parts in the figures.

Figure 1:
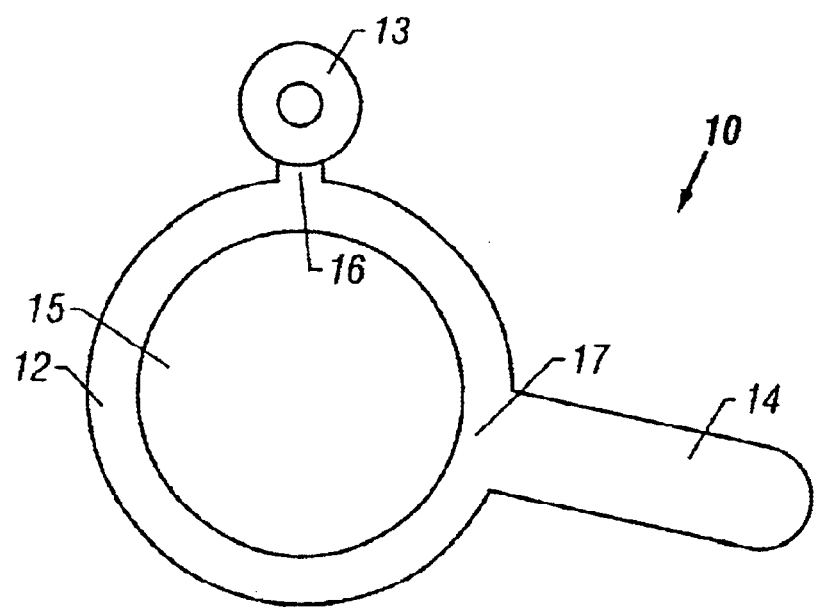
FIG. 1 is a side view of an embodiment of the present invention.
Figure 2:
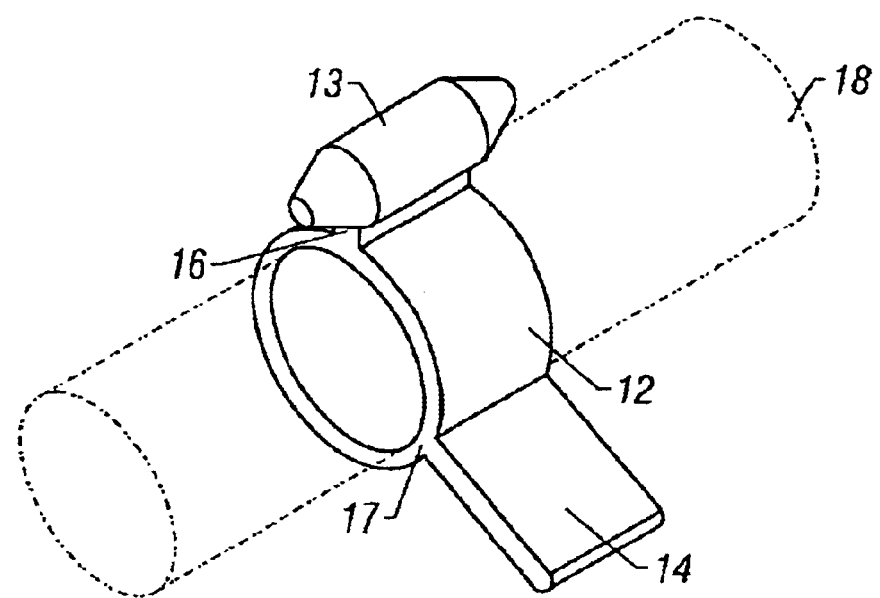
FIG. 2 is an isometric view of an embodiment of the present invention.

Referring to FIGS. 1 and 2, a PC board insertion and extraction device 10 according to the present invention includes a mounting body 12, an engager 13, and an actuator 14. The mounting body 12 is ring-shaped and has a clearance hole 15 therethrough. The engager 13 and the actuator 14 are each integrally connected to the mounting body 12 at connection points 16 and 17, respectively. The engager 13 preferably has rounded and beveled ends to facilitate engagement with a PC board. There is a minimum spacing between engager 13 and actuator 14, or between connection points 16 and 17, for device 10 to be operated properly. If the spacing between engager 13 and actuator 14 is too small, actuator 14 may be jammed into the PC board during operation, which will be discussed in detail below. Device 10 is rotatably and slidably mounted on a cylindrical rod 18 through clearance hole 15 such that device 10 is slidably rotatable along the length of the cylindrical rod 18.

The PC board insertion and extraction device 10 can be constructed and manufactured using a variety of metals and plastics. For metal construction, stainless steel is preferred, although other metals such as aluminum or copper may also be used. The device can be cast-molded or machined. Plastic construction is most preferred, however, because it is most cost-effective. Preferably, injection molding is utilized to construct a plastic insertion and extraction device so that mass production may be effected at low cost.

Figure 3:
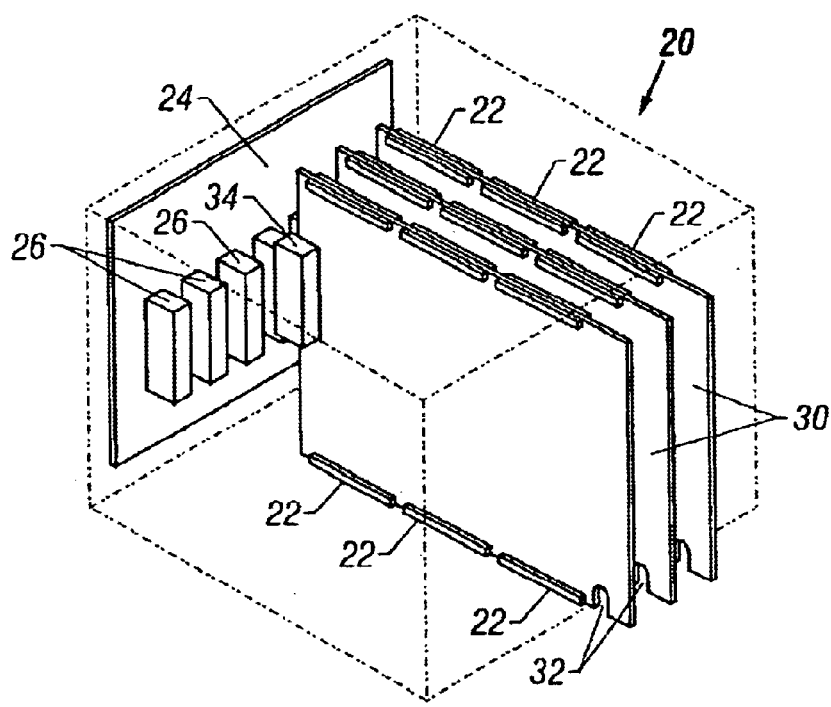
FIG. 3 is a perspective view of a standard PC board card cage removably supporting a plurality of PC boards in parallel slots.

Turning to FIG. 3, a standard PC board card cage 20 removably supporting a plurality of PC boards 30 in parallel slots is illustrated. The card cage 20 comprises a plurality of card guides 22 and a backplane 24 having a plurality of electric receiving connectors 26. Each PC board 30 includes a notch 32 formed in board 30 and electric board contacts 34 formed on board 30. The card guides 22 hold and guide a PC board 30 into card cage 20. The PC board 30 is fully inserted into card cage 20 when the board contacts 34 mate with the corresponding receiving connector 26.

Figure 4:
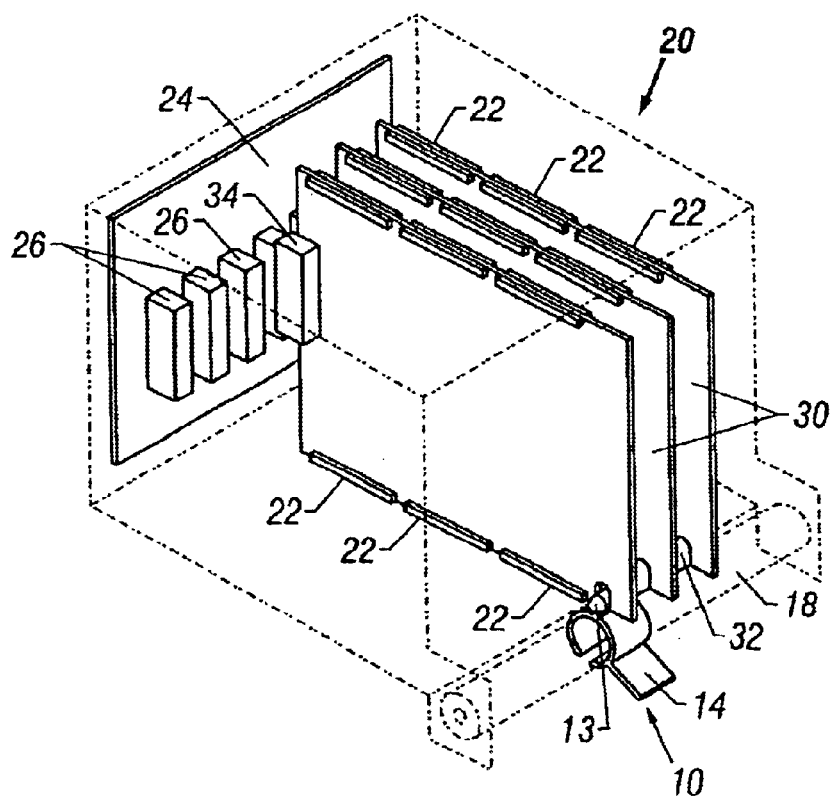
FIGS. 4 and 5 illustrate the operation of an embodiment of the present invention.
Figure 5:
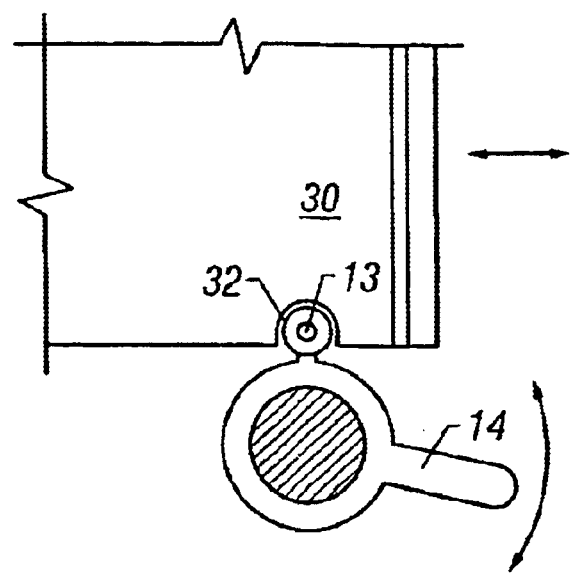

Turning now to FIGS. 4 and 5, the PC board insertion and extraction device 10 operates as follows. The insertion and extraction device 10 is first mounted on a stationary cylindrical rod 18, wherein the two ends of the cylindrical rod 18 are mounted on the two side walls of card cage 20 or on an object stationary relative to PC boards 30, such as an assembly rack (not shown). To insert a PC board 30 into card cage 20, the insertion and extraction device 10 is slid and rotated along the body of the cylindrical rod 18 such that the engager 13 is inserted into notch 32 in the PC board 30, forming an engaged position. A force is then applied to the actuator 14 to push the actuator 14 toward the card cage 20, rotating counter-clockwise in FIG. 5. This motion in turn causes the engager 13 to move toward the card cage 20, urging the PC board 30 to be inserted into the card cage 20 toward the backplane 24 until the board contacts 34 mate with the corresponding receiving connector 26. The PC board 30 is now in the fully inserted position.

Still referring to FIGS. 4 and 5, to extract a fully inserted PC board 30 from the card cage 20, the insertion and extraction device 10 is placed in the engaged position with the PC board 30. A force is then applied to the actuator 14 to pull it away from the card cage 20. This motion causes the engager to also move away from the card cage 20, disengaging the board contacts 34 and the receiving connector 26 and urging the PC board 30 to move away from the backplane 24. This is best shown in FIG. 5, with the insertion and extraction device 10 rotating clockwise and the PC board 30 moving to the right.

Figure 6:
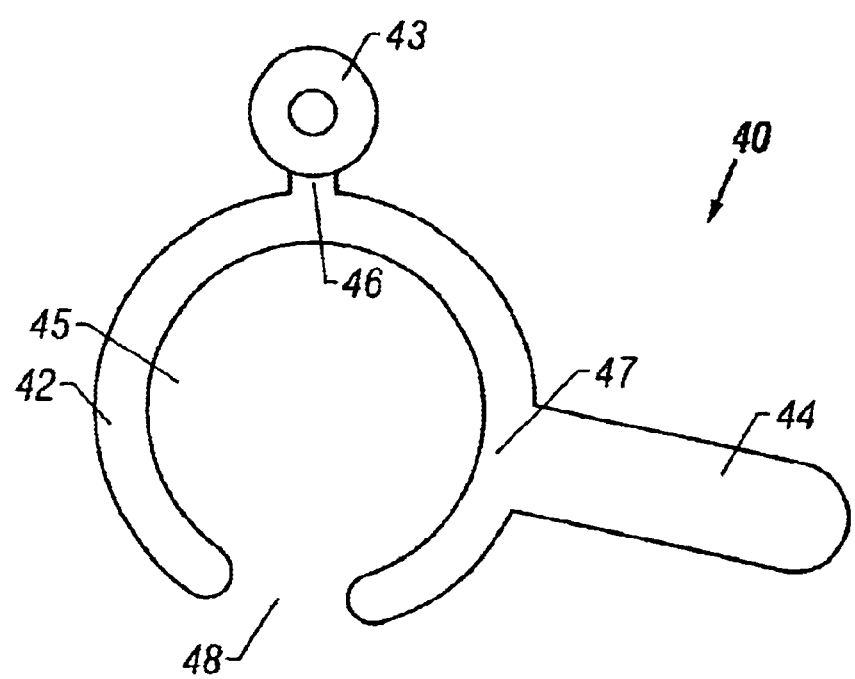
FIG. 6 is a side view of an embodiment of the present invention.

Turning now to FIG. 6, a PC board insertion and extraction device 40 in accordance with another embodiment of the present invention is illustrated. Device 40 includes a mounting body 42, an engager 43, and an actuator 44. The mounting body 42 is shaped like the letter "C" and has a clearance hole 45 therethrough and an opening 48. The engager 43 and the actuator 44 are each integrally connected to the mounting body 42 at connection points 46 and 47, respectively. The engager 43 preferably has rounded and beveled ends to facilitate engagement with a PC board. Similar to device 10 in FIG. 2, there is a minimum spacing between engager 43 and actuator 44, or between connection points 46 and 47, so that device 40 may be operated properly. Device 40 is preferably rotatably and slidably mounted on a cylindrical rod 18 such that device 40 is slidably rotatable along the length of the cylindrical rod 18.

Figure 7:
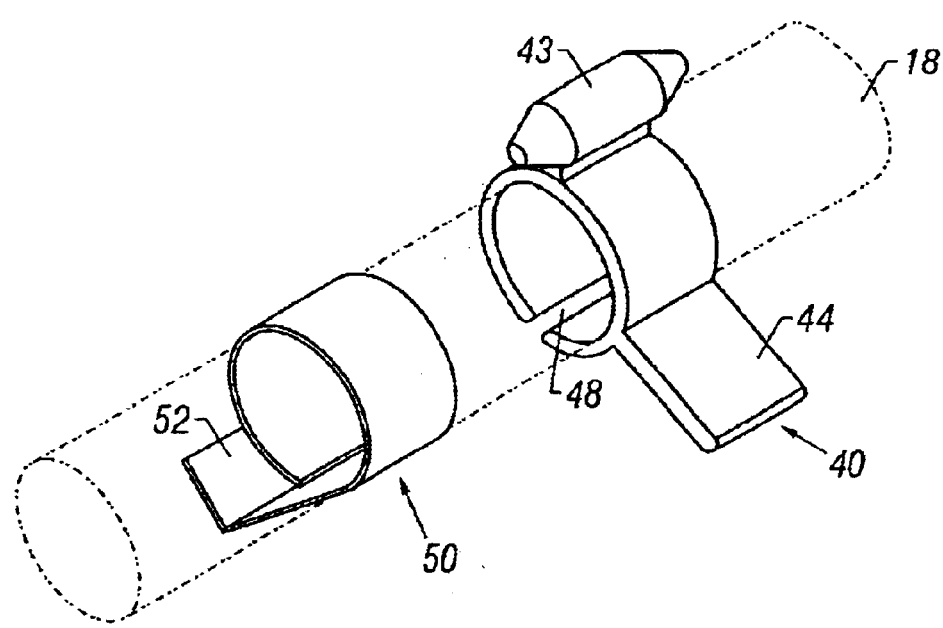
FIG. 7 is an isometric view of an embodiment of the present invention.
Figure 8:
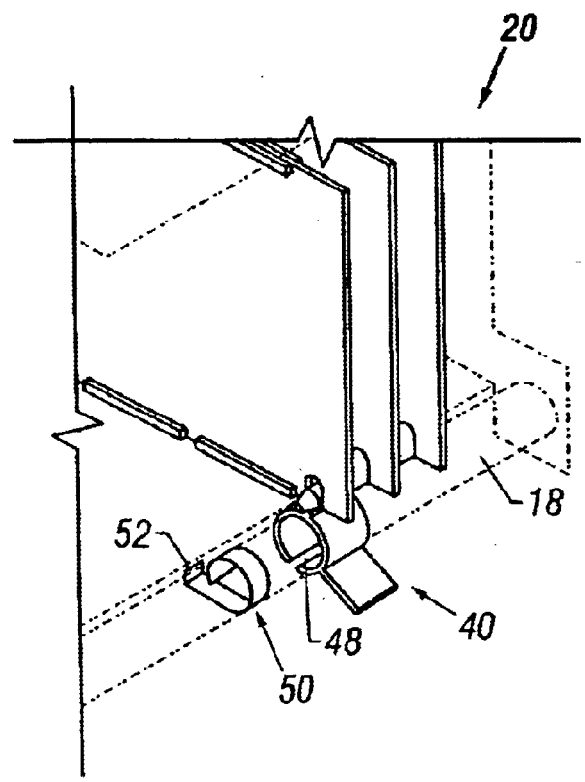
FIG. 8 is a partial perspective view of a PC board card cage and an embodiment of the present invention.

Device 40 is designed mainly for large card cages, although it may be used for small card cages as well. Because a large card cage would require a long cylindrical rod 18, the cylindrical rod 18 may sag in its mid portion over time due to gravity. To prevent this potential problem, a support 50 having an extension 52 is preferably mounted to the mid portion of cylindrical rod 18 as shown in FIGS. 7 and 8. Referring specifically to FIG. 8, extension 52 of support 50 is preferably mounted to the front bottom edge of card cage 20. Alternatively, extension 52 may be mounted to an assembly rack or similar stationary object. In operation, device 40 can slide along the length of the cylindrical rod 18 without being obstructed support 50 by using opening 48 to slide device 40 through support 50. Note that opening 48 may be created anywhere in mounting body 42, and not restricted to the position shown in FIGS. 6-8, as long as the position of opening 48 does not hinder the operation of device 40. Besides having opening 48, device 40 operates just like device 10. Device 40 may also be used with a cylindrical rod 18 without support 50.

Figure 9:
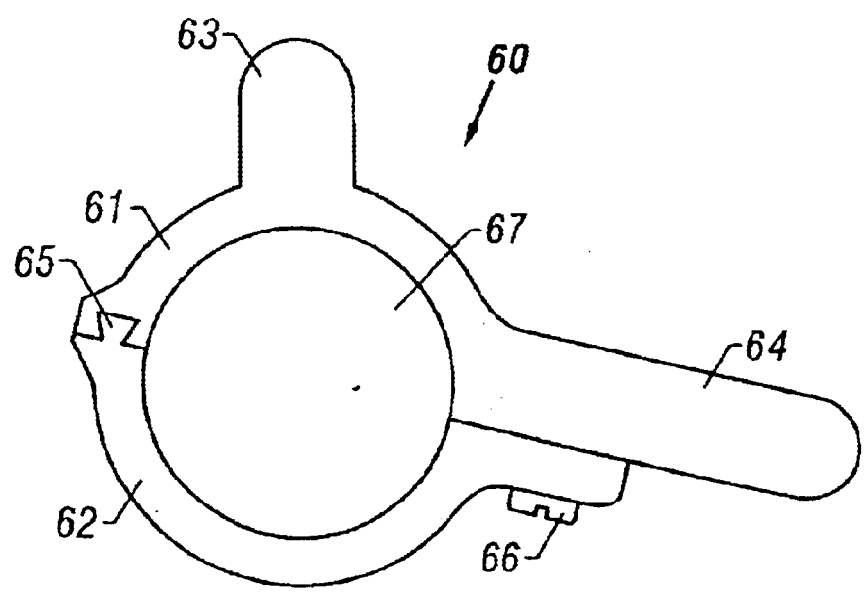
FIG. 9 is a side view of an embodiment of the present invention.

Referring now to FIG. 9, a PC board insertion and extraction device 60 in accordance with yet another embodiment of the present invention is illustrated. Device 60 has a two-piece design, and includes a first mounting arc 61, a second mounting arc 62, an engager 63, and an actuator 64. Mounting arcs 61 and 62 can be securely interconnected with an interlocking mechanism comprising interlock 65 and a screw 66. The interconnection of mounting arcs 61 and 62 form a ring-shaped mounting body having a clearance hole 67 therethrough. Preferably, engager 63 and actuator 64 are each integrally connected to either mounting arc 61 or 62.

Similar to device 10 (shown in FIGS. 1, 2, 4, and 5), device 60 is rotatably and slidably mounted on a cylindrical rod 18 through clearance hole 67 such that device 60 is slidably rotatable along the length of cylindrical rod 18. Also similar to device 10, there is a minimum spacing between engager 63 and actuator 64 so that device 60 may be operated properly. Device 60 operates just like device 10 except device 60 may be removed from cylindrical rod 18 without removing cylindrical rod 18 from card cage 20. Device 60 is removed from cylindrical rod 18 by unscrewing screw 66 and separating mounting arcs 61 and 62.

Figure 10:
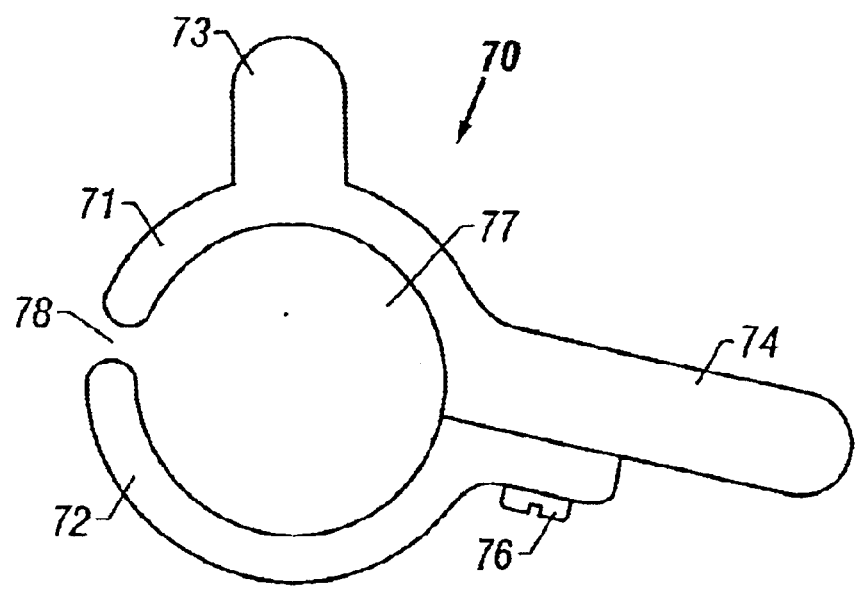
FIG. 10 is a side view of an embodiment of the present invention.

Turning now to FIG. 10, a PC board insertion and extraction device 70 in accordance with still another embodiment of the present invention is illustrated. Device 70 also has a two-piece design, and includes a first mounting arc 71, a second mounting arc 72, an engager 73, and an actuator 74. Mounting arcs 71 and 72 can be securely interconnected with, for example, a screw 76. The interconnection of mounting arcs 71 and 72 form a "C" shaped mounting body having a clearance hole 77 therethrough and an opening 78. Preferably, engager 73 and actuator 74 are each integrally connected to either mounting arc 71 or 72. Similar to device 40 (shown in FIGS. 6-8), device 70 is rotatably and slidably mounted on a cylindrical rod 18 through clearance hole 77 such that device 70 is slidably rotatable along the length of cylindrical rod 18. Also similar to device 40, there is a minimum spacing between engager 73 and actuator 74 so that device 70 may be operated properly. Device 70 operates just like device 40 except device 70 may be removed from cylindrical rod 18 without removing cylindrical rod 18 from card cage 20. Device 70 is removed from cylindrical rod 18 by unscrewing screw 76 and separating mounting arcs 71 and 72. Preferably, mounting arcs 71 and 72 are thicker in regions near actuator 74, where most of the leverage force is exerted. This "gradual thickness" design may also be applied to devices 10, 40 and 60 to enhance the strength of the devices.

The present invention herein has been described with reference to particular embodiments for the purpose of illustrating the principles and application of the present invention. Accordingly, any and all modifications, variations or equivalent arrangements which may occur to those skilled in the art are to be considered to be within the spirit and scope of the present invention as defined by the appended claims.

What is claimed is:

1. A device for facilitating the insertion and extraction of a plurality of PC boards into and from a chassis, comprising:

a rod mounted adjacent to and stationary relative to the plurality of PC boards, the rod having a length that equals at least a spacing between an installed two of the plurality of PC boards;

a mounting body having a first connection point and a second connection point, and being coupled to the rod such that the mounting body is slidably rotatable along the length of the rod;

an engager attached to the mounting body at the first connection point; and an actuator attached to the mounting body at the second connection point.

2. The device of claim 1, wherein there is a minimum spacing between the first connection point and the second connection point.

3. The device of claim 2, wherein:

the rod is cylindrical; and the mounting body is ring-shaped, having a clearance hole therethrough for rotatably and slidably coupling to the rod.

4. The device of claim 3, wherein the rod is mounted along a front edge of the chassis between a first side wall and a second side wall of the chassis.

5. The device of claim 4, wherein the engager has rounded and beveled ends.

6. The device of claim 5, wherein the engager and the actuator are each integrally connected to the mounting body.

7. The device of claim 3, wherein the rod is mounted along a front edge of an assembly rack, into which the chassis is mounted, and between a first side wall and a second side wall of the assembly rack.

8. The device of claim 3, wherein the ring-shaped mounting body forms a contiguous circle.

9. The device of claim 3, wherein the ring-shaped mounting body forms a majority of a contiguous circle.

10. The device of claim 3, wherein the mounting body comprises:

a first mounting body section that includes the first and second connection points;

a second mounting body section; and a mounting body fastener that affixes the first mounting body section to the second mounting body section forming the mounting body.

11. The device of claim 3, wherein:

the plurality of PC boards each comprise:
 a front edge;
 a side edge substantially perpendicular to the front edge; and
 a notch formed in the side edge of the PC board near the front edge; and the rod is mounted such that the engager engages the notch of each of the plurality of PC boards.

* * * * *